US011492509B2

(12) United States Patent
Torfs et al.

(10) Patent No.: US 11,492,509 B2
(45) Date of Patent: Nov. 8, 2022

(54) SOLDER MASK INKJET INKS FOR MANUFACTURING PRINTED CIRCUIT BOARDS

(71) Applicants: AGFA-GEVAERT NV, Mortsel (BE); ELECTRA POLYMER LTD., Tonbridge (GB)

(72) Inventors: Rita Torfs, Mortsel (BE); Johan Loccufier, Mortsel (BE); Clive Landells, Mortsel (BE); Christopher Wall, Mortsel (BE)

(73) Assignees: AGFA-Gevaert NV, Mortsel (BE); Electra Polymer Ltd., Tonbridge (GB)

( * ) Notice: Subject to any disclaimer, the term of this patent is extended or adjusted under 35 U.S.C. 154(b) by 304 days.

(21) Appl. No.: 16/954,587

(22) PCT Filed: Dec. 10, 2018

(86) PCT No.: PCT/EP2018/084157
§ 371 (c)(1),
(2) Date: Jun. 17, 2020

(87) PCT Pub. No.: WO2019/121098
PCT Pub. Date: Jun. 27, 2019

(65) Prior Publication Data
US 2020/0332140 A1 Oct. 22, 2020

(30) Foreign Application Priority Data

Dec. 18, 2017 (EP) ..................... 17208244

(51) Int. Cl.
| | | |
|---|---|---|
| *C09D 11/38* | (2014.01) | |
| *C09D 11/101* | (2014.01) | |
| *C09D 11/102* | (2014.01) | |
| *C09D 11/103* | (2014.01) | |
| *C09D 11/106* | (2014.01) | |
| *C09D 11/107* | (2014.01) | |
| *B41M 5/00* | (2006.01) | |
| *B41M 7/00* | (2006.01) | |
| *H05K 3/00* | (2006.01) | |

(52) U.S. Cl.
CPC ........... *C09D 11/38* (2013.01); *B41M 5/0023* (2013.01); *B41M 7/0045* (2013.01); *C09D 11/101* (2013.01); *C09D 11/102* (2013.01); *C09D 11/103* (2013.01); *C09D 11/106* (2013.01); *C09D 11/107* (2013.01); *H05K 3/0082* (2013.01); *H05K 2203/0551* (2013.01); *H05K 2203/0736* (2013.01)

(58) Field of Classification Search
CPC . B41M 5/0023; B41M 7/0045; C09D 11/101; C09D 11/102; C09D 11/103; C09D 11/106; C09D 11/107; C09D 11/36; C09D 11/38; H05K 3/0082; H05K 2203/0551; H05K 2203/0736
See application file for complete search history.

(56) References Cited

U.S. PATENT DOCUMENTS

| | | | |
|---|---|---|---|
| 2,738,226 A | 3/1956 | Bals | |
| 7,553,891 B2 | 6/2009 | Hoshio et al. | |
| 7,845,785 B2 | 12/2010 | Jang | |
| 8,273,805 B2 | 9/2012 | Satou et al. | |
| 9,267,017 B2 * | 2/2016 | Lebel | C08K 5/5317 |
| 10,167,377 B2 * | 1/2019 | Jeong | C08G 59/304 |
| 2003/0133679 A1 | 7/2003 | Murphy et al. | |
| 2005/0282938 A1 * | 12/2005 | Yamaguchi | G02B 6/4436 523/513 |

FOREIGN PATENT DOCUMENTS

| | | |
|---|---|---|
| CN | 1390318 A | 1/2003 |
| CN | 103649244 A | 3/2014 |
| EP | 1 229 389 A1 | 8/2002 |
| EP | 1 624 001 A1 | 2/2006 |
| EP | 1 543 704 B1 | 5/2006 |
| EP | 2 725 075 A1 | 4/2014 |
| EP | 3 000 853 A1 | 3/2016 |
| EP | 2 809 735 B1 | 5/2018 |
| EP | 3 321 330 A1 | 5/2018 |
| JP | 2005-508023 T | 3/2005 |
| JP | 2010-006909 A | 1/2010 |
| JP | 2010-059299 A | 3/2010 |
| JP | 2010-231220 A | 10/2010 |
| JP | 2011-026403 A | 2/2011 |
| JP | 2012-067151 A | 4/2012 |
| KR | 2001-0090792 A | 10/2001 |
| KR | 2002-0092920 A | 12/2002 |
| TW | 201016799 A | 5/2010 |
| TW | 201213452 A | 4/2012 |
| WO | WO 2000/022036 A1 | 4/2000 |
| WO | WO 2001/029616 A1 | 4/2001 |
| WO | WO 2013/015125 A1 | 2/2015 |

OTHER PUBLICATIONS

Official Communication issued in International Patent Application No. PCT/EP2018/084157, dated Feb. 15, 2019.

* cited by examiner

*Primary Examiner* — Anh T Vo
(74) *Attorney, Agent, or Firm* — Leydig, Voit & Mayer, Ltd.

(57) ABSTRACT

A radiation curable solder mask inkjet ink contains a photo-initiator, a polymerizable compound and a flame retardant wherewith a high quality solder mask withstanding the high thermal stress during the soldering process while maintaining excellent physical properties and flame retardancy may be produced.

15 Claims, No Drawings

SOLDER MASK INKJET INKS FOR MANUFACTURING PRINTED CIRCUIT BOARDS

CROSS REFERENCE TO RELATED APPLICATIONS

This application is a 371 National Stage Application of PCT/EP2018/084157, filed Dec. 10, 2018. This application claims the benefit of European Application No. 17208244.8, filed Dec. 18, 2017, which is incorporated by reference herein in its entirety.

BACKGROUND OF THE INVENTION

1. Field of the Invention

The present invention relates to a solder mask inkjet ink and an inkjet method for manufacturing Printed Circuit Boards.

2. Description of the Related Art

Inkjet printing methods have been proposed to further improve the manufacturing process of Printed Circuit Boards (PCBs).

Inkjet printing methods and inkjet inks have been disclosed for legend printing in for example EP-A 2725075 (Agfa) and U.S. Pat. No. 7,845,785B2 (Markem-Imaje), and for applying an etch resist on a copper surface in for example EP-A 2809735 (Agfa) and EP-A 3000853 (Agfa).

By reducing the complexity and minimizing waste such inkjet printing methods render the manufacture of PCBs more cost effective.

Also for applying the solder mask, inkjet printing methods and inkjet inks have been disclosed in for example EP-A 1543704 (Avecia) and EP-A 1624001 (Taiyo Ink Manufacturing).

Flame retardant coatings used for manufacturing liquid crystal display elements and printed circuit boards are disclosed in U.S. Pat. No. 8,273,805 (JNC Corporation). The use of solid flame retardant additives in coatings for PCBs is disclosed in U.S. Pat. No. 7,553,891 (Fuji Xerox).

Solder masks are permanent protective coatings that perform a number of functions during the fabrication, assembly and end use of PCBs.

One of the main purposes of solder mask is to protect the circuitry from interacting with solder during the assembly process.

A solder mask also protects the laminate, holes and traces from collecting contaminants and from degrading during the service life of the PCB.

A solder mask also acts as an insulator of known dielectric property between components and traces of the PCB.

The solder mask should not increase the overall flammability of the printed circuit board.

UV curable inks are preferred for the design of solder mask inks.

Free radical polymerizable inks are fast curing and allow a high degree of crosslinking, resulting in excellent chemical resistance and mechanical properties.

Cationic curing inks do not suffer from shrinkage on curing and, when combined with a thermal post cure, provide very good thermal, chemical and physical resistance.

There is still a need for designing solder mask inkjet inks, with good flame retardancy and which are able to withstand the high thermal stress induced during the soldering process in the manufacture of PCBs.

SUMMARY OF THE INVENTION

It is an object of the invention to provide a solder mask inkjet ink for manufacturing a PCB wherein a high quality solder mask, in particular withstanding the high thermal stress during the soldering process while maintaining excellent physical properties and flame retardancy, may be produced.

The object of the invention is realized by the solder mask inkjet ink defined below.

Further objects of the invention will become apparent from the description hereinafter.

DETAILED DESCRIPTION OF THE PREFERRED EMBODIMENTS

Definitions

The term "monofunctional" in e.g. monofunctional polymerizable compound means that the polymerizable compound includes one polymerizable group.

The term "difunctional" in e.g. difunctional polymerizable compound means that the polymerizable compound includes two polymerizable groups.

The term "polyfunctional" in e.g. polyfunctional polymerizable compound means that the polymerizable compound includes more than two polymerizable groups.

The term "alkyl" means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl, etc.

Unless otherwise specified a substituted or unsubstituted alkyl group is preferably a $C_1$ to $C_6$-alkyl group.

Unless otherwise specified a substituted or unsubstituted alkenyl group is preferably a $C_2$ to $C_6$-alkenyl group.

Unless otherwise specified a substituted or unsubstituted alkynyl group is preferably a $C_2$ to $C_6$-alkynyl group.

Unless otherwise specified a substituted or unsubstituted aralkyl group is preferably a phenyl or naphthyl group including one, two, three or more $C_1$ to $C_6$-alkyl groups.

Unless otherwise specified a substituted or unsubstituted alkaryl group is preferably a $C_7$ to $C_{20}$-alkyl group including a phenyl group or naphthyl group.

Unless otherwise specified a substituted or unsubstituted aryl group is preferably a phenyl group or naphthyl group.

Unless otherwise specified a substituted or unsubstituted heteroaryl group is preferably a five- or six-membered ring substituted by one, two or three oxygen atoms, nitrogen atoms, sulphur atoms, selenium atoms or combinations thereof.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

Unless otherwise specified a substituted alkyl group, a substituted alkenyl group, a substituted alkynyl group, a substituted aralkyl group, a substituted alkaryl group, a substituted aryl and a substituted heteroaryl group are preferably substituted by one or more constituents selected from the group consisting of methyl, ethyl, n-propyl, isopropyl, n-butyl, isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —$NO_2$.

Radiation Curable Solder Mask Inkjet Ink

The radiation curable solder mask inkjet ink comprises a photoinitiator, a polymerizable compound, and a flame retardant as disclosed below.

The radiation curable solder mask inkjet ink may further comprise other polymerizable compounds, colorants, polymeric dispersants, a polymerization inhibitor, or a surfactant.

The solder mask inkjet ink can be cured with e-beam but is preferably cured with UV light, more preferably with UV light from UV LEDs. The solder mask inkjet ink is thus preferably a UV curable inkjet ink.

For reliable industrial inkjet printing, the viscosity of the radiation curable inkjet inks is preferably no more than 20 mPa·s at 45° C., more preferably between 1 and 18 mPa·s at 45° C., and most preferably between 4 and 14 mPa·s at 45° C.

For good image quality and adhesion, the surface tension of the radiation curable inkjet ink is preferably in the range of 18 to 70 mN/m at 25° C., more preferably in the range of 20 to 40 mN/m at 25° C.

Flame Retardant

The radiation curable solder mask inkjet ink comprises a flame retardant according to Formula I,

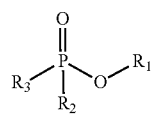

Formula I wherein
- $R_1$ is independently selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl group;
- $R_2$ is selected from the group consisting of $OR_4$, a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl group;
- $R_3$ is selected from the group consisting of $OR_5$, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl group;
- $R_4$ and $R_5$ are selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl group;
- with the proviso that at least one of $R_1$ to $R_5$ represents a substituted or unsubstituted aryl group.

In a preferred embodiment, at least two of the groups $R_1$ to $R_5$ are represented by a substituted or unsubstituted aryl group.

In a most preferred embodiment, $R_1$ to $R_5$ represent a substituted or unsubstituted aryl group.

The flame retardant according to the present invention may comprise two or more functional groups selected from the group consisting of a phosphate and a phosphonate.

In a preferred embodiment, the molecular weight of the flame retardant is preferably not more than 3000, more preferably not more than 1500 and most preferably not more than 1000.

In a particularly preferred embodiment, the flame retardant according to the present invention is halogen free.

In the most preferred embodiment, the flame retardant according to the present invention is not further substituted by heteroatoms.

Another particularly preferred flame retardant according to the present invention has a chemical structure according to Formula II,

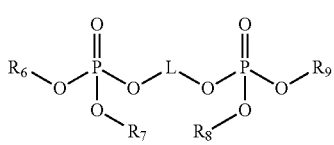

Formula II wherein
- $R_6$ to $R_9$ independently represent a substituted or unsubstituted aryl group, and L represent a divalent linking group coupled to the phosphate groups via an aromatic carbon atom.

Preferably, the flame retardant according to Formula II is a diphosphate ester of a difunctional phenol compound selected from the group consisting of bisphenol A, bisphenol AP, bisphenol B, bisphenol BP, bisphenol C, bisphenol E, bisphenol F, bisphenol G, bisphenol M, bisphenol S, bisphenol P, bisphenol PH, bisphenol TMC, bisphenol Z and resorcinol.

$R_6$ to $R_9$ preferably represent a phenyl group.

Flame retardants according to the present invention are in Table 1 without being limited thereto.

TABLE 1
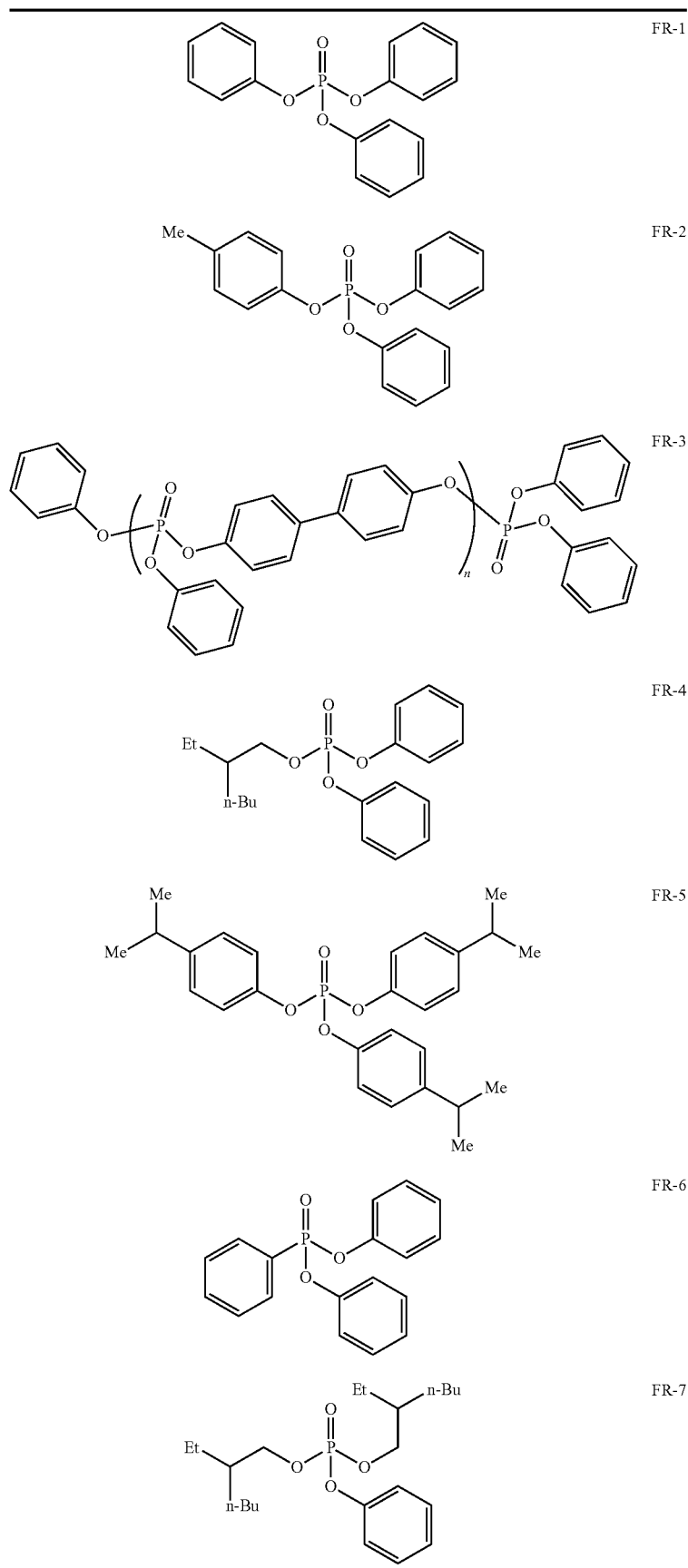

TABLE 1-continued
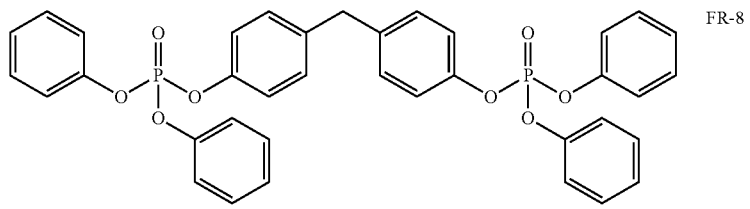
FR-8
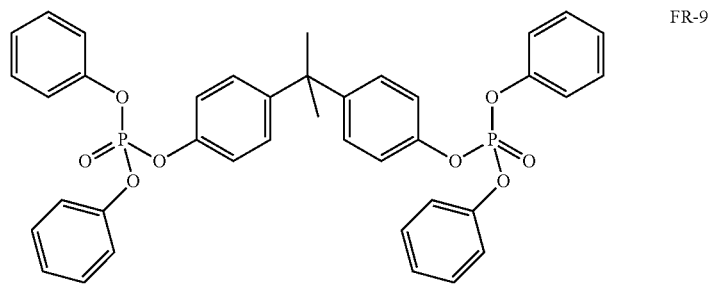
FR-9
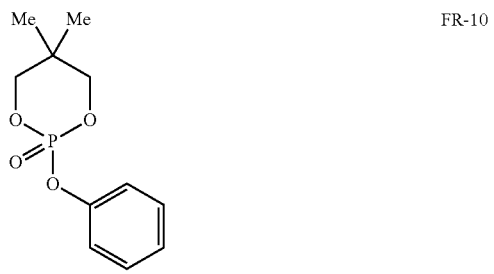
FR-10
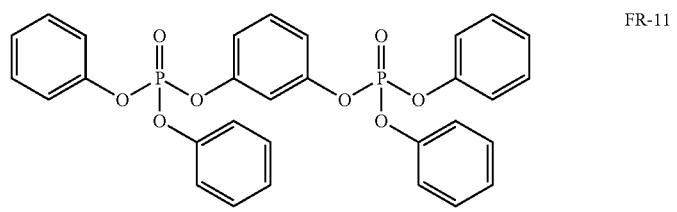
FR-11
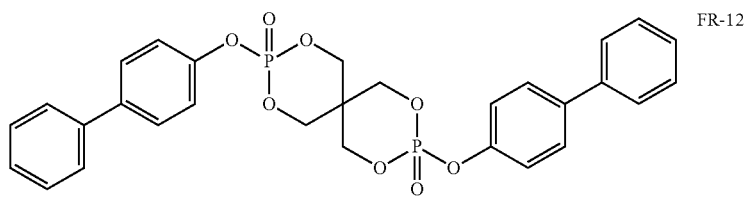
FR-12
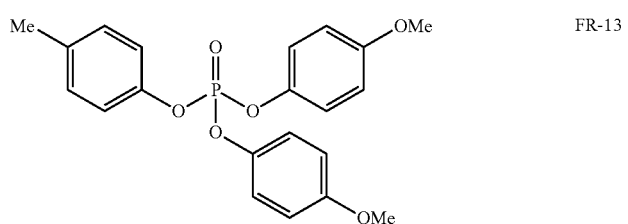
FR-13

TABLE 1-continued

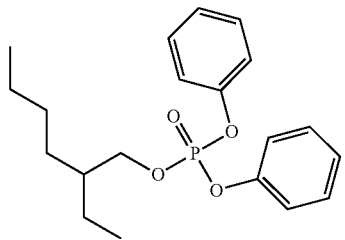 [SMILES: CCCCC(CC)COP(=O)(Oc1ccccc1)Oc1ccccc1]

FR-14

The amount of flame retardant in the radiation curable solder mask inkjet ink is preferably between 0.25 and 20 wt %, more preferably between 0.5 and 15 wt %, most preferably between 1 and 10 wt %, relative to the total weight of the inkjet ink.

The radiation curable inkjet may in addition to the flame retardants described above comprise other flame retardants.

Polymerizable Compounds

The solder mask inkjet ink may contain cationic or free radical polymerizable compounds.

Free Radical Polymerizable Compounds

The free radical polymerizable compounds may be monomers, oligomers and/or prepolymers. Monomers are also referred to as diluents.

These monomers, oligomers and/or prepolymers may possess different degrees of functionality. A mixture including combinations of mono-, di-, tri- and higher functional monomers, oligomers and/or prepolymers may be used. The viscosity of the radiation curable inkjet ink may be adjusted by varying the ratio between the monomers and oligomers.

In a preferred embodiment, the monomer, oligomer or polymer includes at least one acrylate group as polymerizable group.

Preferred monomers and oligomers are those listed in paragraphs [0106] to [0115] in EP-A 1911814.

In a preferred embodiment, the radiation curable inkjet ink comprises a monomer containing a vinyl ether group and an acrylate or methacrylate group. Such monomers are disclosed in EP-A 2848659, paragraphs [0099] to [0104]). A particular preferred monomer containing a vinyl ether group and an acrylate group is 2-(2-vinyloxyethoxy)ethyl acrylate.

In a particular preferred embodiment, the solder mask inkjet ink comprises a free radical polymerizable compound selected from the group consisting of neopentyl-glycol hydroxypivalate diacrylate, isobornyl acrylate, dipropylene glycol diacrylate, trimethylol propane triacrylate, and 2-(vinylethoxy)ethyl acrylate.

Cationic Polymerizable Compounds

The cationic polymerizable compounds may be monomers, oligomers and/or prepolymers.

These monomers, oligomers and/or prepolymers may possess different degrees of functionality. A mixture including combinations of mono-, di-, tri- and higher functional monomers, oligomers and/or prepolymers may be used. The viscosity of the radiation curable inkjet ink may be adjusted by varying the ratio between the monomers and oligomers.

In a preferred embodiment, the monomer, oligomer or polymer includes at least one epoxy or one vinyl ether or one oxetane group as polymerizable group.

Examples of monomers, oligomers or prepolymers containing at least one epoxide group include cycloaliphatic epoxy compounds such as bis-(3,4-epoxycyclohexyl)-adipate, 3,4-epoxycyclohexylmethyl-3,4-epoxycyclohexane carboxylate, poly[(2-oxiranyl)-1,2-cyclohexanediol]-2-ethyl-2-(hydroxymethyl)-1,3-propanediol ether, 7-oxa-bicyclo[4.1.0]heptane-3-carboxylic acid, and 7-oxabicyclo[4.1.0]hept-3-ylmethyl ester; ether derivatives including diol derivatives such as 1,4-butanediol diglycidylether and neopentyl glycol diglycidylether; and glycidyl ethers such as n-butyl glycidyl ether, distilled butyl glycidyl ether, 2-ethylhexyl glycidyl ether, C8-C10 aliphatic glycidyl ether, C12-C14 aliphatic glycidyl ether, o-cresyl glycidyl ether, p-tertiary butyl phenyl glycidyl ether, nonyl phenyl glycidyl ether, phenyl glycidyl ether, cyclohexanedimethanol diglycidyl ether, polypropylene glycol diglycidyl ether, poly glycol diglycidyl ether, dibromo neopentyl glycol diglycidyl ether, trimethylopropane triglycidyl ether, castor oil triglycidyl ether, propoxylated glycerin triglycidyl ether, sorbitol polyglycidyl ether, glycidyl ester of neodecanoic acid; and glycidyl amines such as epoxidized meta-xylene diamine.

Examples of monomers, oligomers or prepolymers containing at least one vinyl ether group include bis[4-(vinyloxy)butyl]1,6-hexanediylbiscarbamate, bis[4-(vinyloxy)butyl]isophthalate, bis[4-(vinyloxy)butyl](methylenedi-4,1-phenylene)-biscarbamate, bis[4-(vinyloxy)butyl]succinate, bis[4-(vinyloxy)butyl]terephthalate, 2-(2-vinyloxyethoxy)ethyl acrylate , bis[4-(vinyloxymethyl)cyclohexylmethyl] glutarate, 1,4-butanediol divinyl ether, 1,4-butanediol vinyl ether, butyl vinyl ether, tert-butyl vinyl ether, 2-chloroethyl vinyl ether, 1,4-cyclohexanedimethanol divinyl ether, 1,4-cyclohexanedimethanol vinyl ether, cyclohexyl vinyl ether, di(ethylene glycol) divinyl ether, di(ethylene glycol) vinyl ether, diethyl vinyl orthoformate, dodecyl vinyl ether, ethylene glycol vinyl ether, 2-ethylhexyl vinyl ether, ethyl-1-propenyl ether, ethyl vinyl ether, isobutyl vinyl ether, phenyl vinyl ether, propyl vinyl ether, tris[4-(vinyloxy)butyl]trimellitate.

Examples of monomers, oligomers or prepolymers containing at least one oxetane group include 3,3'-oxybis(methylene)bis(3-ethyloxetane), 1,4-bis(((3-ethyloxetan-3-yl)methoxy)methyl)benzene, and 3-ethyl-3-[(2-ethylhexyloxy) 25 methyl]oxetane.

In a preferred embodiment, the radiation curable inkjet ink comprises a monomer containing a vinyl ether group and an acrylate or methacrylate group. Such monomers are disclosed in EP-A 2848659, paragraphs [0099] to [0104]). A particular preferred monomer containing a vinyl ether group and an acrylate group is 2-(2-vinyloxyethoxy)ethyl acrylate.

In another preferred embodiment, the solder mask inkjet ink comprises a cationic polymerizable compound selected from the group consisting of bis-(3,4-epoxycyclohexyl)adipate, 3,4-epoxycyclohexylmethyl-3,4-epoxycyclohexane carboxylate, and 7-oxa-bicyclo[4.1.0]heptane-3-carboxylic acid 7-oxabicyclo[4.1.0]hept-3-ylmethyl ester.

Adhesion Promoters

The solder mask inkjet ink preferably comprises an adhesion promoter, such as those disclosed in WO2004/028225.
A preferred adhesion promoter is 2-carboxyethylacryate.

Phenolic Compound

The solder mask inkjet ink preferably comprises a phenolic compound comprising at least two phenolic groups. The phenolic compound may comprises two, three, four or more phenolic groups.

A preferred phenolic compound comprises two phenolic groups.

A particular preferred phenolic compound has a structure according to Formula II:

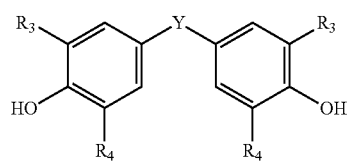

Formula II wherein,
  $R_3$ and $R_4$ are independently selected from the group consisting of a hydrogen atom, a substituted or unsubstituted alkyl group, a hydroxyl group and a substituted or unsubstituted alkoxy group,
  Y is selected from the group consisting of $CR_5R_6$, $SO_2$, SO, S, O and CO,
  $R_5$ and $R_6$ are independently selected from the group consisting of a hydrogen atom, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted (hetero)aryl group,
  $R_5$ and $R_6$ may represent the necessary atoms to form a 5 to 8 membered ring.

Y is preferably $CR_5R_6$ or $SO_2$, $R_5$ an $R_6$ preferably represent a hydrogen atom or an alkyl group.

In another preferred embodiment, the phenolic compound is a polymer comprising at least two phenolic groups.

Preferably, the polymer comprising at least two phenolic groups is a branched or hyperbranched polymer.

A preferred polymer comprising at least two phenolic groups is a phenolic resin, i.e. a novolac or a resole.

Phenolic resins are reaction products of phenolic compounds with aldehydes or ketones. Phenols which could be used are: phenol, o-cresol, p-cresol, m-cresol, 2,4-xylenol, 3,5-xylenol, or 2,5-xylenol. Aldehydes which can be used are formaldehyde, acetaldehyde, or acetone.

The most widely used method for novolac preparation is the acid-catalysed one-step synthesis of phenol/cresol and formaldehyde, which leads to a statistical structure of resin (see reaction scheme below).

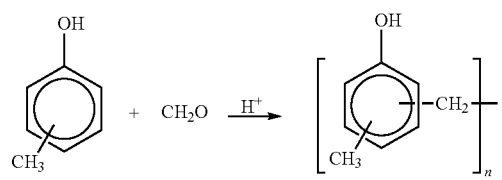

Generally, hydrochloric acid, sulfuric acid, p-toluene sulfuric acid or oxalic acid is used as catalyst. Various proportions of formaldehyde and phenol/cresol are usually employed in regular novolac resins. Higher phenol contents increase the degree of branching whereas reaction can take place at the ortho and para-positions. For resins with a higher p-cresol content more linear polymers are obtained due to that the para-position is blocked by presence of the methyl group.

Novolac copolymers of phenol and formaldehyde will have a high degree of branching, since reaction takes place both an ortho- and para-positions. In order to reduce the viscosity a high degree of branching and/or low molecular weights are preferred. For cresylic novolacs the use of m-cresol can give easier high molecular weights as compared to o-cresol and p-cresol.

Phenolic resins can also be prepared in base catalyzed reactions, which lead to the formation of resoles. Resoles are phenolic polymers having also methylol groups.

For incorporation in the solder mask inkjet ink, preference is given to novolac resins to obtain a sufficient ink stability since novolac resins are only reactive at high temperatures (>150 C). Resoles may react already at lower temperatures and due to the presence of methylol groups may result in a poorer chemical resistance of the inkjet ink.

More well defined branched polymers having at least two phenolic groups may be prepared using 4-hydroxyphenyl-methylcarbinol, as disclosed in U.S. Pat. No. 5,554,719 and US2005250042. A particular preferred branched polymer having at least two phenolic groups prepared from 4-hydroxyphenylmethylcarbinol has been developed by Du Pont Electronic Polymers and is supplied by Hydrite Chemical Company under the tradename PSH-B or PB-5 (CASRN 166164-76-7).

Examples of phenolic compounds according to the present invention are given in Table 2 without being limited thereto.

TABLE 2

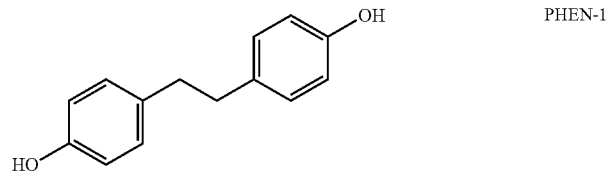

PHEN-1

TABLE 2-continued

| Structure | Label |
|---|---|
| 2,2-bis(4-hydroxyphenyl)propane (bisphenol A) | PHEN-2 |
| bis(4-hydroxyphenyl) sulfone | PHEN-3 |
| bis(4-hydroxy-3-methylphenyl)methane | PHEN-4 |
| 1,1-bis(4-hydroxy-3-methylphenyl)ethane | PHEN-5 |
| 1,1-bis(4-hydroxyphenyl)ethane | PHEN-6 |
| bis(4-hydroxyphenyl) sulfide | PHEN-7 |
| bis(4-hydroxyphenyl) ether | PHEN-8 |
| 1,1-bis(4-hydroxyphenyl)cyclohexane | PHEN-9 |
| butane-1,4-diyl bis(4-hydroxybenzoate) | PHEN-10 |
| ethane-1,2-diyl bis(3,4-dihydroxybenzoate) | PHEN-11 |

TABLE 2-continued
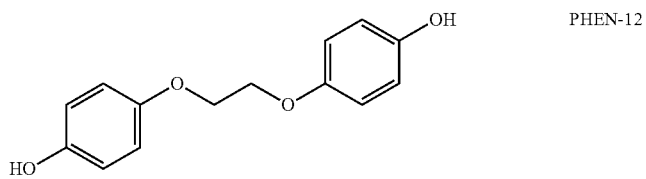 PHEN-12
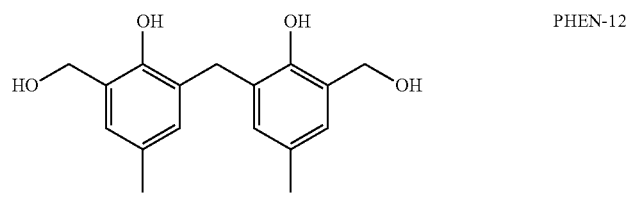 PHEN-12
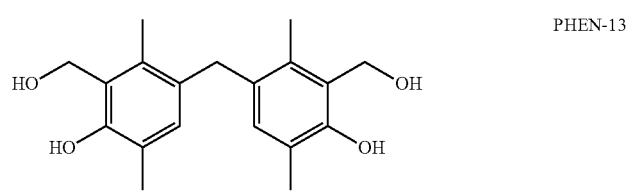 PHEN-13
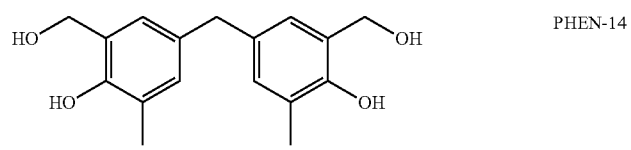 PHEN-14
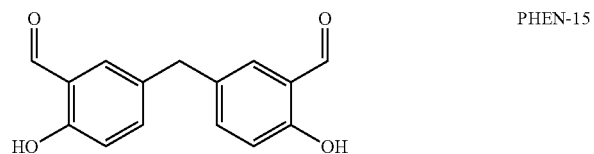 PHEN-15
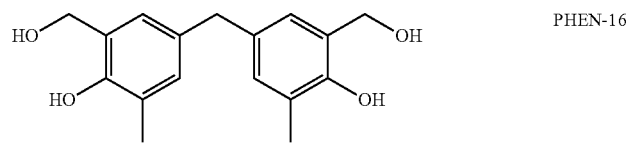 PHEN-16
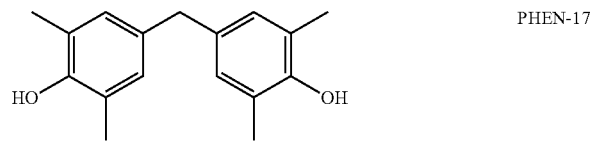 PHEN-17
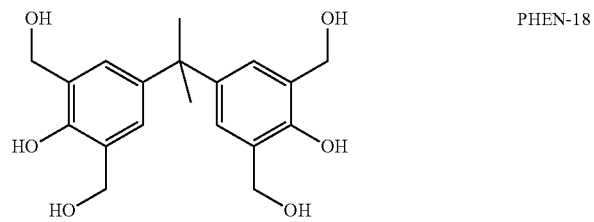 PHEN-18
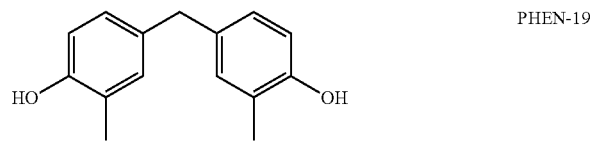 PHEN-19

TABLE 2-continued
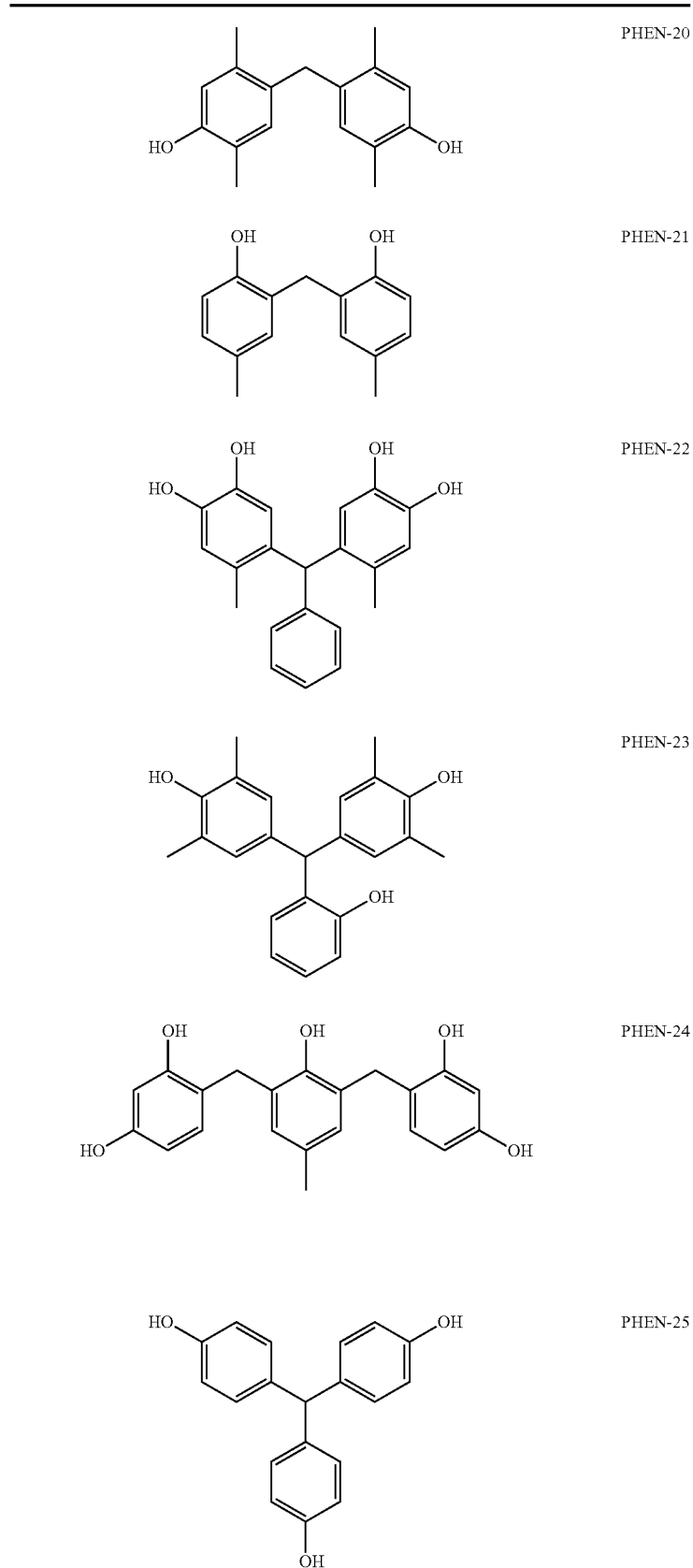
PHEN-20
PHEN-21
PHEN-22
PHEN-23
PHEN-24
PHEN-25

TABLE 2-continued
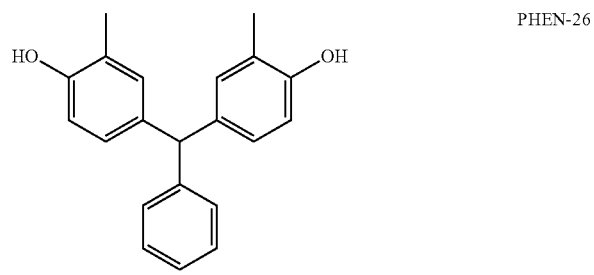
PHEN-26
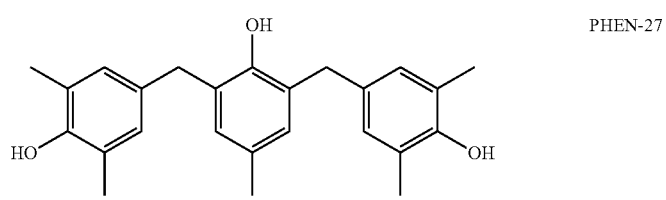
PHEN-27
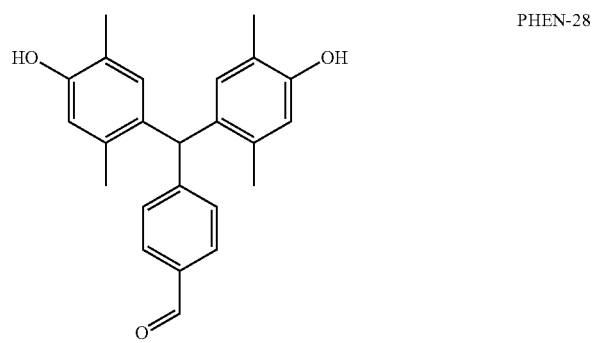
PHEN-28
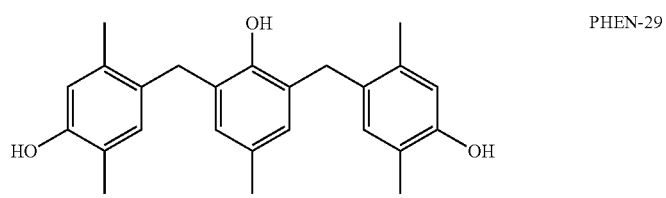
PHEN-29
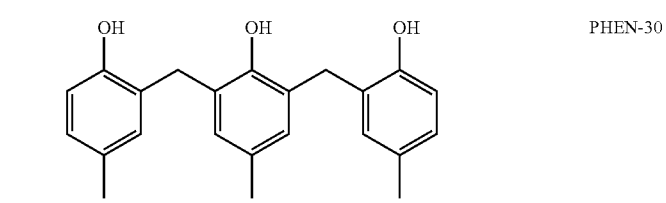
PHEN-30
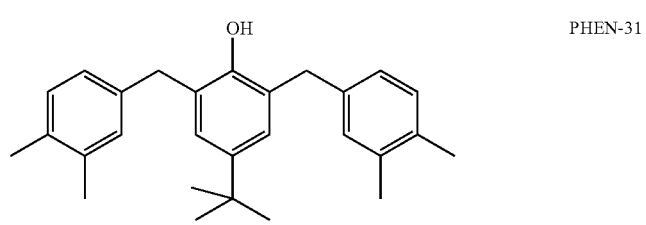
PHEN-31

TABLE 2-continued

| Structure | Label |
|---|---|
| (tetrakis(4-hydroxyphenyl)methane structure) | PHEN-32 |
| (1,4-bis(bis(4-hydroxyphenyl)methyl)benzene structure) | PHEN-33 |
| (phenolic oligomer structure) | PHEN-34 |
| (phenolic oligomer structure) | PHEN-35 |
| (phenolic oligomer structure) | PHEN-36 |
| (phenolic oligomer structure) | PHEN-37 |
| (phenolic oligomer structure) | PHEN-38 |
| (phenolic oligomer structure) | PHEN-39 |

TABLE 2-continued
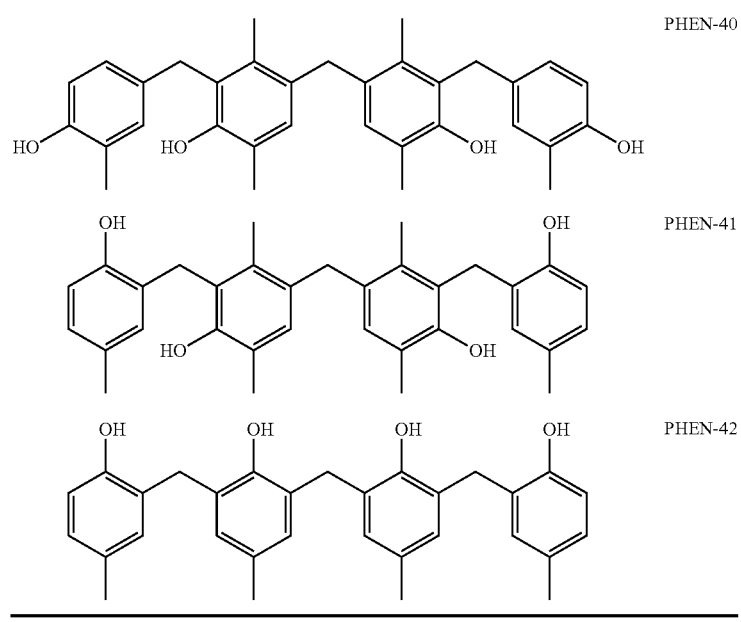
Typical examples of polymers having at least two phenolic groups are given in Table 3 below without being limited thereto.
TABLE 3
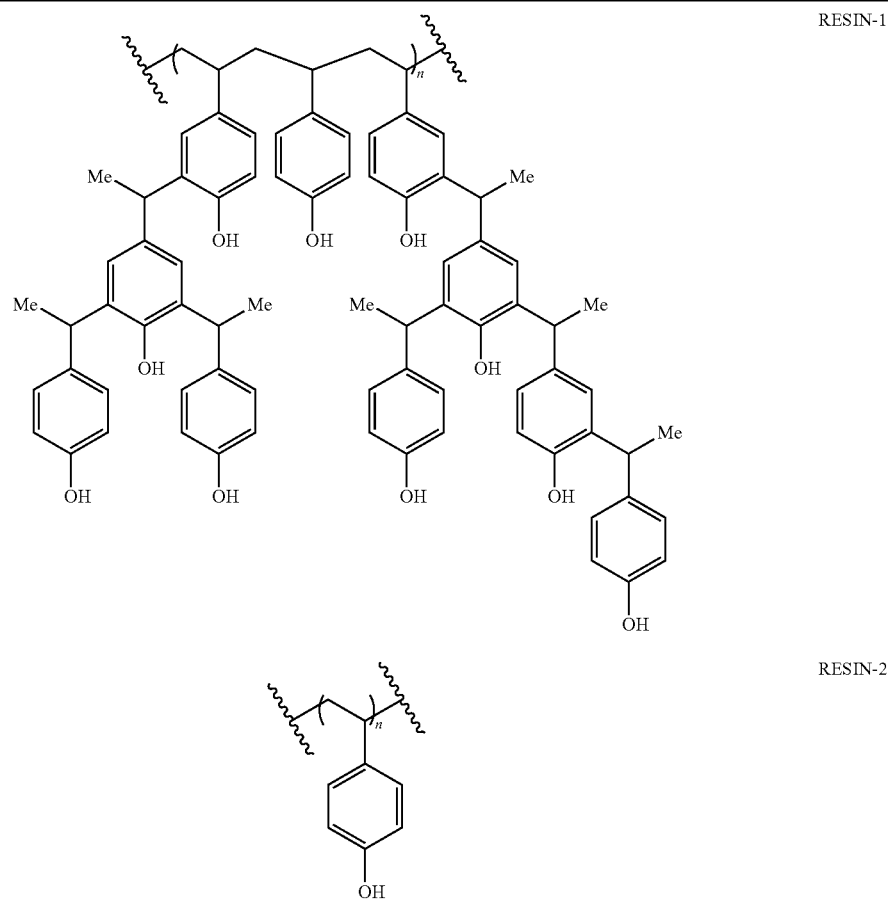

TABLE 3-continued

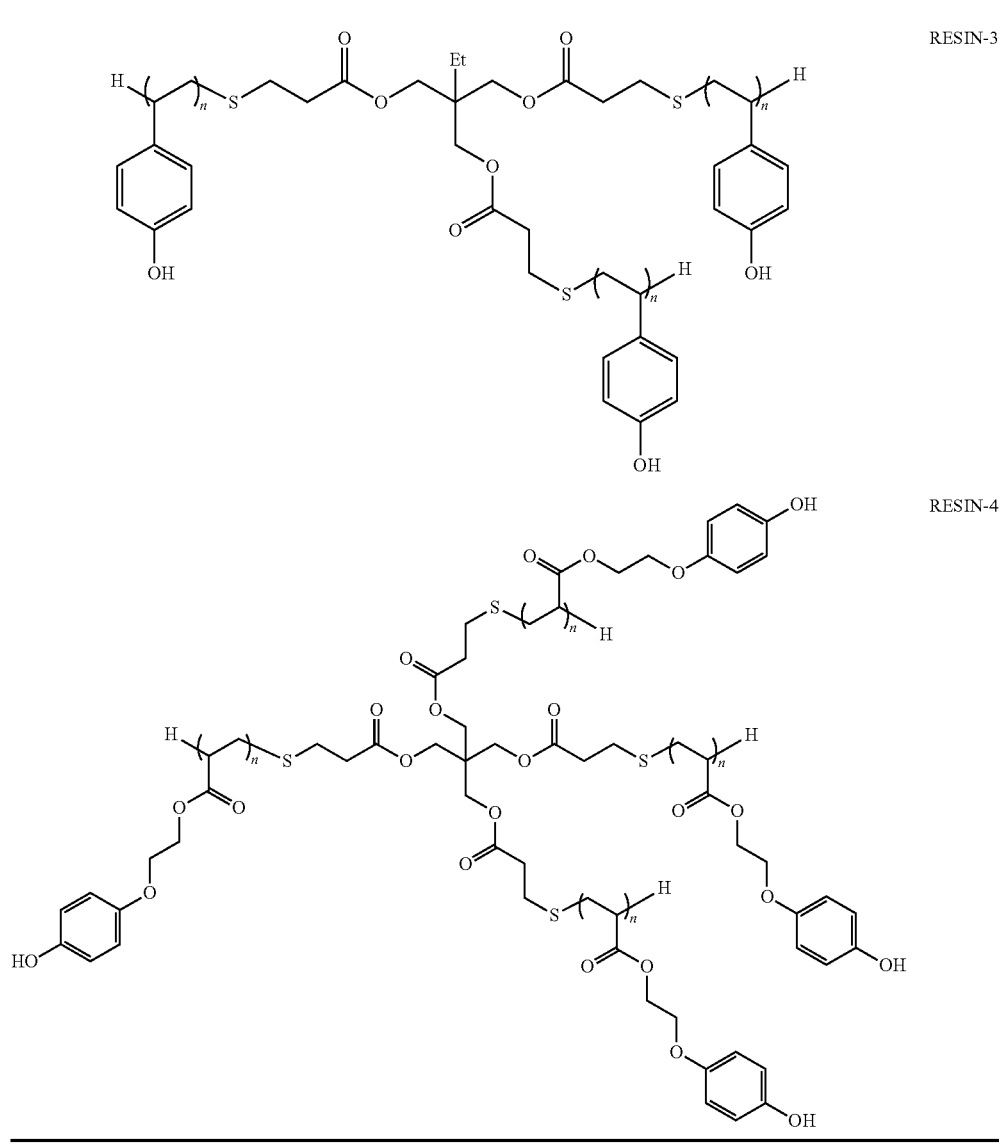

The amount of phenolic compounds is preferably between 0.5 and 20 wt %, more preferably between 1 and 15 wt %, most preferably between 2.5 and 10 wt %, relative to the total weight of the inkjet ink.

Colorants

The solder mask inkjet ink may be a substantially colourless inkjet ink, but preferably the radiation curable inkjet includes at least one colorant.

The colorant in the solder mask inkjet ink may be a pigment or a dye, but is preferably a pigment.

A colour pigment may be chosen from those disclosed by HERBST, Willy, et al. Industrial Organic Pigments, Production, Properties, Applications, 3rd edition. Wiley-VCH, 2004, ISBN 3527305769.

Suitable pigments are disclosed in paragraphs [0128] to [0138] of WO2008/074548.

Pigment particles in inkjet inks should be sufficiently small to permit free flow of the ink through the inkjet-printing device, especially at the ejecting nozzles. It is also desirable to use small particles for maximum colour strength and to slow down sedimentation. Most preferably, the average pigment particle size is no larger than 150 nm. The average particle size of pigment particles is preferably determined with a Brookhaven Instruments Particle Sizer BI90plus based upon the principle of dynamic light scattering.

In PCBs, the solder mask typically has a blue or green colour. The blue pigment is preferably one of the phthalocyanine series. Examples of blue pigments are C.I. Pigment Blue 1, 15, 15:1, 15:2, 15:3, 15:4, 15:6, 16, 24 and 60.

Green pigments are generally a mixture of blue and yellow or orange pigments or may be green pigments or dyes per se, such as halogenated phthalocyanines, for example copper or nickel brominated phthalocyanine.

In a preferred embodiment, the colorant is present in an amount of 0.2 to 6.0 wt %, more preferably 0.5 to 2.5 wt %, based on the total weight of the radiation curable inkjet ink.

Polymeric Dispersants

If the colorant in the radiation curable inkjet is a pigment, then the radiation curable inkjet ink preferably contains a dispersant, more preferably a polymeric dispersant, for dispersing the pigment.

Suitable polymeric dispersants are copolymers of two monomers but they may contain three, four, five or even more monomers. The properties of polymeric dispersants depend on both the nature of the monomers and their distribution in the polymer. Copolymeric dispersants preferably have the following polymer compositions:
- statistically polymerized monomers (e.g. monomers A and B polymerized into ABBAABAB);
- alternating polymerized monomers (e.g. monomers A and B polymerized into ABABABAB);
- gradient (tapered) polymerized monomers (e.g. monomers A and B polymerized into AAABAABBABBB);
- block copolymers (e.g. monomers A and B polymerized into AAAAABBBBBB) wherein the block length of each of the blocks (2, 3, 4, 5 or even more) is important for the dispersion capability of the polymeric dispersant;
- graft copolymers (graft copolymers consist of a polymeric backbone with polymeric side chains attached to the backbone); and
- mixed forms of these polymers, e.g. blocky gradient copolymers.

Suitable polymeric dispersants are listed in the section on "Dispersants", more specifically [0064] to [0070] and [0074] to [0077], in EP-A 1911814.

Commercial examples of polymeric dispersants are the following:
- DISPERBYK™ dispersants available from BYK CHEMIE GMBH;
- SOLSPERSE™ dispersants available from NOVEON;
- TEGO™ DISPERS™ dispersants from EVONIK;
- EDAPLAN™ dispersants from MÜNZING CHEMIE;
- ETHACRYL™ dispersants from LYONDELL;
- GANEX™ dispersants from ISP;
- DISPEX™ and EFKA™ dispersants from CIBA SPECIALTY CHEMICALS INC;
- DISPONER™ dispersants from DEUCHEM; and
- JONCRYL™ dispersants from JOHNSON POLYMER.

Photoinitiators and Photoinitiating Systems

The radiation curable inkjet preferably contains at least one photoinitiator, but may contain a photoinitiating system including a plurality of photoinitiators and/or co-initiators.

Depending on the polymerizable compounds used in the solder mask inkjet ink, a cationic or free radical initiator or initiating system, or a combination thereof may be used.

A cationic initiator is a chemical compound that initiates polymerisation of suitable monomers, oligomers and pre-polymers, such as those containing at least one epoxy, oxetane or vinyl ether group, when exposed to actinic radiation by the generation of a Brönsted acid.

A free radical photoinitiator is a chemical compound that initiates polymerization of monomers and oligomers when exposed to actinic radiation by the formation of a free radical. A Norrish Type I initiator is an initiator which cleaves after excitation, yielding the initiating radical immediately. A Norrish type II-initiator is a photoinitiator which is activated by actinic radiation and forms free radicals by hydrogen abstraction from a second compound that becomes the actual initiating free radical. This second compound is called a polymerization synergist or co-initiator. Both type I and type II photoinitiators can be used in the present invention, alone or in combination.

Suitable photoinitiators are disclosed in CRIVELLO, J. V., et al. Photoinitiators for Free Radical Cationic and Anionic Photopolymerization. 2nd edition. Edited by BRADLEY, G. London, UK: John Wiley and Sons Ltd, 1998. p. 276-293.

Specific examples of cationic photoinitiators may include, but are not limited to, the following compounds or combinations thereof: bis[4-(diphenylsulphonio)-phenyl]sulphide bis-hexafluorophosphate or bis-hexafluoroantimonate which may optionally be in combination with a mono- or poly-[4-(phenylthiodiphenyl)] sulphonium hexafluorophosphate or hexafluoroantimonate; bis[4-(di(4-(2-hydroxyethyl)phenyl) sulphonio-phenyl]sulphide bis-hexafluorophosphate; bis[4-(di(4-(2-hydroxyethyl)phenyl) sulphonio)-phenyl]sulphide bis-hexafluoroantimonate; ($\eta^6$-2,4-(cyclopentadienyl) [(1,2,3,4,5,6-$\eta$)-(methylethyl)benzene]-iron(II) hexafluorophosphate; 4-isopropyl-4-methyl diphenyliodonium hexafluorophosphate; diphenyliodonium hexafluorophosphate; 4-isopropyl-4-methyl diphenyliodonium tetrakis-(pentafluorophenyl)borate; diphenyliodonium tetrakis-(penta-fluorophenyl)borate and; 2'-hydroxy-2-phenyl-3-toluenesulphonyloxy-propiophenone, 10-biphenyl-4-yl-2-isopropyl-9-oxo-9H-thioxanthen-10-ium hexafluorophosphate.

Specific examples of free radical photoinitiators may include, but are not limited to, the following compounds or combinations thereof: benzophenone and substituted benzophenones, 1-hydroxycyclohexyl phenyl ketone, thioxanthones such as isopropylthioxanthone, 2-hydroxy-2-methyl-1-phenylpropan-1-one, 2-benzyl-2-dimethylamino-(4-morpholinophenyl)butan-1-one, benzyl dimethylketal, bis (2,6-dimethylbenzoyl)-2,4,4-trimethylpentylphosphine oxide, 2,4,6 trimethylbenzoyl-diphenylphosphine oxide, 2,4,6-trimethoxybenzoyldiphenylphosphine oxide, 2-methyl-1-[4-(methylthio)phenyl]-2-morpholinopropan-1-one, 2,2-dimethoxy-1, 2-diphenylethan-1-one or 5,7-diiodo-3-butoxy-6-fluorone.

Suitable commercial free radical photoinitiators include Irgacure™ 184, Irgacure™ 500, Irgacure™ 369, Irgacure™ 1700, Irgacure™ 651, Irgacure™ 819, Irgacure™ 1000, Irgacure™ 1300, Irgacure™ 1870, Darocur™ 1173, Darocur™ 2959, Darocur™ 4265 and Darocur™ ITX available from CIBA SPECIALTY CHEMICALS, Lucerin™ TPO available from BASF AG, Esacure™ KT046, Esacure™ KIP150, Esacure™ KT37 and Esacure™ EDB available from LAMBERTI, H-Nu™ 470 and H-Nu™ 470X available from SPECTRA GROUP Ltd.

The photoinitiator, preferably the free radical photoinitiator, may be a so-called diffusion hindered photoinitiator. A diffusion hindered photoinitiator is a photoinitiator which exhibits a much lower mobility in a cured ink layer than a monofunctional photoinitiator, such as benzophenone. Several methods can be used to lower the mobility of the photoinitiator. One way is to increase the molecular weight of the photoinitiators so that the diffusion speed is reduced, e.g. polymeric photoinitiators. Another way is to increase its reactivity so that it is built into the polymerizing network, e.g. multifunctional photoinitiators (having 2, 3 or more photoinitiating groups) and polymerizable photoinitiators.

The diffusion hindered photoinitiator for the radiation curable inkjet is preferably selected from the group consisting of non-polymeric multifunctional photoinitiators, oligomeric or polymeric photoinitiators and polymerizable photoinitiators. Most preferably the diffusion hindered photoinitiator is a polymerizable initiator or a polymeric photoinitiator.

A preferred diffusion hindered photoinitiator contains one or more photoinitiating functional groups derived from a Norrish type I-photoinitiator selected from the group consisting of benzoinethers, benzil ketals, α,α-dialkoxyacetophenones, α-hydroxyalkylphenones, α-aminoalkylphenones, acylphosphine oxides, acylphosphine sulphides, α-haloketones, α-halosulfones and phenylglyoxalates.

A preferred diffusion hindered photoinitiator contains one or more photoinitiating functional groups derived from a Norrish type II-initiator selected from the group consisting of benzophenones, thioxanthones, 1,2-diketones and anthraquinones.

Suitable diffusion hindered photoinitiators are also those disclosed in EP-A 2065362 in paragraphs [0074] and [0075] for difunctional and multifunctional photoinitiators, in paragraphs [0077] to [0080] for polymeric photoinitiators and in paragraphs [0081] to [0083] for polymerizable photoinitiators.

A preferred amount of photoinitiator is 0.1-20 wt %, more preferably 2-15 wt %, and most preferably 3-10 wt % of the total weight of the radiation curable inkjet ink.

In order to increase the photosensitivity further, the radiation curable inkjet may additionally contain co-initiators. Suitable examples of co-initiators can be categorized in three groups: 1) tertiary aliphatic amines such as methyldiethanolamine, dimethylethanolamine, triethanolamine, triethylamine and N-methylmorpholine; (2) aromatic amines such as amylparadimethyl-aminobenzoate, 2-n-butoxyethyl-4-(dimethylamino)benzoate, 2-(dimethylamino)-ethylbenzoate, ethyl-4-(dimethylamino)benzoate, and 2-ethylhexyl-4-(dimethylamino)benzoate; and (3) (meth)acrylated amines such as dialkylamino alkyl(meth)acrylates (e.g., diethylaminoethylacrylate) or N-morpholinoalkyl-(meth)acrylates (e.g., N-morpholinoethyl-acrylate). The preferred co-initiators are aminobenzoates.

When one or more co-initiators are included into the radiation curable inkjet ink, preferably these co-initiators are diffusion hindered for safety reasons.

A diffusion hindered co-initiator is preferably selected from the group consisting of non-polymeric di- or multifunctional co-initiators, oligomeric or polymeric co-initiators and polymerizable co-initiators. More preferably the diffusion hindered co-initiator is selected from the group consisting of polymeric co-initiators and polymerizable co-initiators. Most preferably the diffusion hindered co-initiator is a polymerizable co-initiator having at least one (meth) acrylate group, more preferably having at least one acrylate group.

The radiation curable inkjet ink preferably includes a polymerizable or polymeric tertiary amine co-initiator.

Preferred diffusion hindered co-initiators are the polymerizable co-initiators disclosed in EP-A 2053101 in paragraphs [0088] and [0097].

The radiation curable inkjet inks preferably includes the (diffusion hindered) co-initiator in an amount of 0.1 to 20 wt %, more preferably in an amount of 0.5 to 15 wt %, most preferably in an amount of 1 to 10 wt % of the total weight of the radiation curable inkjet ink.

Polymerization Inhibitors

The radiation curable inkjet ink may contain at least one inhibitor for improving the thermal stability of the ink.

Suitable polymerization inhibitors include phenol type antioxidants, hindered amine light stabilizers, phosphor type antioxidants, hydroquinone monomethyl ether commonly used in (meth)acrylate monomers, and hydroquinone. t-butylcatechol, pyrogallol, 2,6-di-tert.butyl-4-methylphenol (=BHT) and phenothiazine may also be used.

Suitable commercial inhibitors are, for example, Sumilizer™ GA-80, Sumilizer™ GM and Sumilizer™ GS produced by Sumitomo Chemical Co. Ltd.; Genorad™ 16, Genorad™18 and Genorad™ 22 from Rahn AG; Irgastab™UV10 and Irgastab™ UV22, Tinuvin™ 460 and CGS20 from Ciba Specialty Chemicals; Florstab™ UV range (UV-1, UV-2, UV-5 and UV-8) from Kromachem Ltd, Additol™ S range (S100, S110, S120 and S130) and PTZ from Cytec Solvay Group.

The inhibitor is preferably a polymerizable inhibitor.

Since excessive addition of these polymerization inhibitors may lower the curing speed, it is preferred that the amount capable of preventing polymerization is determined prior to blending. The amount of a polymerization inhibitor is preferably lower than 5 wt %, more preferably lower than 3 wt % of the total radiation curable inkjet ink.

Surfactants

The radiation curable inkjet may contain at least one surfactant, but preferably no surfactant is present.

The surfactant can be anionic, cationic, non-ionic, or zwitter-ionic and is usually added in a total quantity less than 1 wt % based on the total weight of the radiation curable inkjet ink.

Suitable surfactants include fluorinated surfactants, fatty acid salts, ester salts of a higher alcohol, alkylbenzene sulfonate salts, sulfosuccinate ester salts and phosphate ester salts of a higher alcohol (for example, sodium dodecylbenzenesulfonate and sodium dioctylsulfosuccinate), ethylene oxide adducts of a higher alcohol, ethylene oxide adducts of an alkylphenol, ethylene oxide adducts of a polyhydric alcohol fatty acid ester, and acetylene glycol and ethylene oxide adducts thereof (for example, polyoxyethylene nonylphenyl ether, and SURFYNOL™ 104, 104H, 440, 465 and TG available from AIR PRODUCTS & CHEMICALS INC.).

Preferred surfactants are selected from fluoric surfactants (such as fluorinated hydrocarbons) and silicone surfactants. The silicone surfactants are preferably siloxanes and can be alkoxylated, polyether modified, polyether modified hydroxy functional, amine modified, epoxy modified and other modifications or combinations thereof. Preferred siloxanes are polymeric, for example polydimethylsiloxanes.

Preferred commercial silicone surfactants include BYK™ 333 and BYK™ UV3510 from BYK Chemie and Tego Rad 2100 from Evonik Industries.

In a preferred embodiment, the surfactant is a polymerizable compound.

Preferred polymerizable silicone surfactants include a (meth)acrylated silicone surfactant. Most preferably the (meth)acrylated silicone surfactant is an acrylated silicone surfactant, because acrylates are more reactive than methacrylates.

In a preferred embodiment, the (meth)acrylated silicone surfactant is a polyether modified (meth)acrylated polydimethylsiloxane or a polyester modified (meth)acrylated polydimethylsiloxane.

Preferably the surfactant is present in the radiation curable inkjet ink in an amount of 0 to 3 wt % based on the total weight of the radiation curable inkjet ink.

Preparation of Inkjet Inks

The preparation of pigmented radiation curable inkjet inks is well-known to the skilled person. Preferred methods of preparation are disclosed in paragraphs [0076] to [0085] of WO2011/069943.

Manufacture of an Electronic Device

The method of manufacturing an electronic device according to the present invention includes the steps of:
- jetting a radiation curable solder mask inkjet ink as described below on a dielectric substrate containing an electrically conductive pattern; and
- curing the jetted solder mask inkjet ink.

The electronic device is preferably a Printed Circuit Board.

The radiation curable solder mask inkjet ink may be cured by exposing the ink to actinic radiation, such as electron beam or ultraviolet (UV) radiation.

Preferably the radiation curable inkjet ink is cured by UV radiation, more preferably using UV LED curing.

The method preferably includes a thermal treatment. The thermal treatment is preferably carried out after the curing step.

In a preferred embodiment the thermal treatment is carried out at a temperature from 80° C. to 250° C. The temperature is preferably not less than 100° C., more preferably not less than 120° C. To prevent charring of the solder mask, the temperature is preferably not greater than 200° C., more preferably not greater than 160° C.

The thermal treatment is typically carried out between 15 and 90 minutes.

The purpose of the thermal treatment is to further increase the polymerization degree of the solder mask.

This further polymerization during the thermal treatment may be accelerated by adding radical initiators, blocked thermal acid generators, blocked acid catalysts and/or thermosetting compounds which promote thermal curing of polymers, such as peroxides, azo compounds, acid anhydrides, and phenolics, to the solder mask inkjet ink.

The dielectric substrate of the electronic device may be any non-conductive material. The substrate is typically a paper/resin composite or a resin/fibre glass composite, a ceramic substrate, a polyester or a polyimide.

The electrically conductive pattern is typically made from any metal or alloy which is conventionally used for preparing electronic devices such as gold, silver, palladium, nickel/gold, nickel, tin, tin/lead, aluminium, tin/aluminium and copper. The electrically conductive pattern is preferably made from copper.

Inkjet Printing Devices

The radiation curable inkjet ink may be jetted by one or more print heads ejecting small droplets in a controlled manner through nozzles onto a substrate, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing. Other inkjet print heads can be used and include various types, such as a continuous type.

The inkjet print head normally scans back and forth in a transversal direction across the moving ink-receiver surface. Often the inkjet print head does not print on the way back. Bi-directional printing is preferred for obtaining a high areal throughput. Another preferred printing method is by a "single pass printing process", which can be performed by using page wide inkjet print heads or multiple staggered inkjet print heads which cover the entire width of the ink-receiver surface. In a single pass printing process the inkjet print heads usually remain stationary and the ink-receiver surface is transported under the inkjet print heads.

Curing Devices

The radiation curable inkjet ink can be cured by exposing them to actinic radiation, such as electron beam or ultraviolet radiation. Preferably the radiation curable inkjet ink is cured by ultraviolet radiation, more preferably using UV LED curing.

In inkjet printing, the curing means may be arranged in combination with the print head of the inkjet printer, travelling therewith so that the curable liquid is exposed to curing radiation very shortly after been jetted.

In such an arrangement, with the exception of UV LEDs, it can be difficult to provide a small enough radiation source connected to and travelling with the print head. Therefore, a static fixed radiation source may be employed, e.g. a source of curing UV-light, connected to the radiation source by means of flexible radiation conductive means such as a fibre optic bundle or an internally reflective flexible tube.

Alternatively, the actinic radiation may be supplied from a fixed source to the radiation head by an arrangement of mirrors including a mirror upon the radiation head.

The source of radiation may also be an elongated radiation source extending transversely across the substrate to be cured. It may be adjacent the transverse path of the print head so that the subsequent rows of images formed by the print head are passed, stepwise or continually, beneath that radiation source.

Any ultraviolet light source, as long as part of the emitted light can be absorbed by the photo-initiator or photo-initiator system, may be employed as a radiation source, such as, a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:
- UV-A: 400 nm to 320 nm
- UV-B: 320 nm to 290 nm
- UV-C: 290 nm to 100 nm.

In a preferred embodiment, the radiation curable inkjet ink is cured by UV LEDs. The inkjet printing device preferably contains one or more UV LEDs preferably with a wavelength larger than 360 nm, preferably one or more UV LEDs with a wavelength larger than 380 nm, and most preferably UV LEDs with a wavelength of about 395 nm.

Furthermore, it is possible to cure the ink image using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. a fast curing speed and a high curing degree.

For facilitating curing, the inkjet printing device often includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

EXAMPLES

Materials

All materials used in the following examples were readily available from standard sources such as ALDRICH CHEMICAL Co. (Belgium) and ACROS (Belgium) unless otherwise specified. The water used was deionized water.

CTFA is a cyclic trimethylpropane formal acrylate available as Sartomer™ SR531 from ARKEMA.

ACMO is acryloyl morpholine available from RAHN.

CD420 is a monofunctional acrylic monomer available as Sartomer™ CD420 from ARKEMA.

TMPTA is trimethylolpropane triacrylate available as Sartomer™ SR351 from ARKEMA.

ITX is Speedcure™ ITX, a mixture of isopropyl thioxanthone isomers, from LAMBSON SPECIALTY CHEMICALS.

TPO is 2,4,6-trimethylbenzoyldiphenylphosphine oxide, supplied by RAHN AG.

EPD is ethyl-4-(dimethylamino)benzoate, available under the trade name of Genocure™ EPD from RAHN AG.

BAPO is a bis(2,4,6-trimethylbenzoyl)phenylphosphineoxide photoinitiator available as Irgacure™ 819 from BASF.

TTA3150 is Poly[(2-oxiranyl)-1,2-cyclohexanediol]-2-ethyl-2-(hydroxymethyl)-1,3-propanediol ether available from Jiangsu Tetrachem.

2005 is 7-oxabicyclo[4.1.0]hept-3-ylmethyl 7-oxabicyclo[4.1.0]heptane-3-carboxylate available from IGM resins.

G22 is Genorad™ 22 available from Rahn AG.

BL550sol is a 20wt % solution in propylene carbonate of BL550.

BL550 is Omnicat BL550 available from IGM resins.

Tego Rad 2100 is a polysiloxane acrylate slip agent from Evonik Industries.

INHIB is a mixture forming a polymerization inhibitor having a composition according to Table 4.

TABLE 4

| Component | wt % |
| --- | --- |
| DPGDA | 82.4 |
| p-methoxyphenol | 4.0 |
| 2,6-di-tert-butyl-4-methylphenol | 10.0 |
| Cupferron ™ AL | 3.6 |

Cupferron™ AL is aluminum N-nitrosophenylhydroxylamine from WAKO CHEMICALS LTD.

Ebecryl 1360 AK is a polysiloxane hexa acrylate slip agent from ALLNEX.

DPGDA is dipropylenediacrylate, available as Sartomer SR508 from ARKEMA.

VEEA is 2-(vinylethoxy)ethyl acrylate available from NIPPON SHOKUBAI, Japan.

Cyan is SUN FAST BLUE 15:4, a cyan pigment available from SUN CHEMICALS.

Yellow is CROMOPHTAL YELLOW D 1085J, a yellow pigment from BASF.

Disperbyk 162 is a dispersing agent and has been precipitated from a solution available from BYK (ALTANA).

FR-01 is a flame retardant commercially available under the tradename Emerald NH1 from CHEMTURA.

FR-02 is a flame retardant commercially available under the tradename Disflamoll DPK from LANXESS.

FR-05 is a flame retardant commercially available under the tradename Reofos® 65 from CHEMTURA.

FR-09 is a flame retardant commercially available under the tradename ADK STAB FP-600 from ADEKA PALMAROLE.

FR-15 is a flame retardant commercially available under the tradename Santiciser® 141 from FERRO.

FR-C01 is a flame retardant commercially available under the tradename Exolit OP560 from CLARIANT and having the following chemical structure.

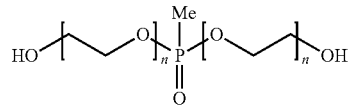

FR-C02 is a flame retardant commercially available under the tradename Disflamoll TOF from LANXESS and having the following chemical structure.

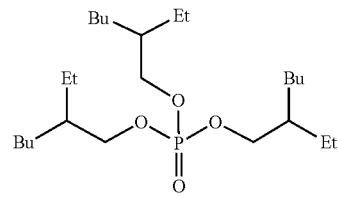

FR-C03 is a flame retardant commercially available under the tradename Disflamoll 4090N from LANXESS and having the following chemical structure.

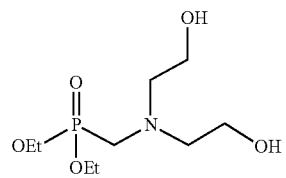 [SMILES: CCOP(=O)(CN(CCO)CCO)OCC]

FR-C04 is a flame retardant commercially available under the tradename TBEP from KAHL and having the following chemical structure.

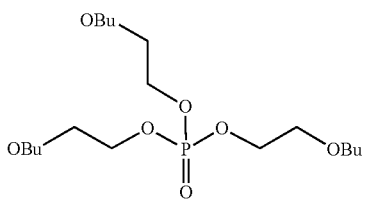

Methods

Coatings/Prints of the Solder Mask Inkjet Inks

To evaluate UV curing, adhesion, solvent and solder resistance of the solder mask inkjet inks, the inks were coated on a brushed copper foil (35μ) at a coating thickness of 25μ and cured using a H-bulb (3 passes×450 mJ). Additionally, the coatings were thermally cured at 150° C. during 60 minutes.

Inks were evaluated by eye and touch after UV curing for cure speed and given a rating from 1 (very dry) to 5 (wet). Inks were evaluated for final properties adhesion and solvent resistance after thermal cure.

X-Hatch Adhesion

X-hatch adhesion was measured by cutting a 4×4 grid pattern in the soldermask coating using a scalpel. Grid cuts were spaced 1 mm apart. After cutting the grid, the adhesion was evaluated by applying a self-adhesive tape (Scotch 600) to the surface and removing by hand.

A visual evaluation resulted in an adhesion quality ranging from 1 (very good adhesion) to 5 (very poor adhesion).

Evaluation of the Flame Retardancy

The flame retardancy of the cured inkjet inks were evaluated by a vertical burn test.

A 127 mm×25 mm sample was held at one end in a vertical position. A burner flame, under an angle of 45° C., was then applied to the free end of the sample for 10 seconds. After removal of the flame, the time (T1) was measured for the flaming combustion to cease. Then, the flame was again applied during 10 seconds and the time for the flaming combustion to cease (T2) was again measured.

Evaluation Solder Resistance

The solder resistance of the solder mask inkjet inks was evaluated using a SPL600240 Digital Dynamic Solder Pot available from L&M PRODUCTS filled with a "K" Grade 63:37 tin/lead solder available from SOLDER CONNECTION. The temperature of the solder was set at 260° C.

Using a cotton wool ball, a solder flux SC7560A from SOLDER CONNECTION was applied on the surface of the samples (i.e. coatings of the solder mask inkjet ink on a copper surface) where the X-hatch adhesion test had been carried out to clean the surface. The solder flux was dried by placing the samples for 1 minute above the solder pot.

A solder wave was created and the samples were passed over the wave twice (5 secs/pass) after which the samples were rinsed and allowed to cool to room temperature.

The adhesion of the solder mask inkjet inks on the copper surface was then evaluated with a tape test on the cooled samples. Self-adhesive tape Scotch 600 from 3M, was applied to the coating and the tape was removed immediately thereafter by hand.

A visual evaluation resulted in an adhesion quality ranging from 1 (very good adhesion) to 5 (very poor adhesion).

Viscosity

The viscosity of the inks was measured at 25° C. using a Brookfield DV-II+ Pro viscometer with Spindle #18 at a speed of 100 rpm.

For industrial inkjet printing, the viscosity at 25° C. using Spindle #18 at 100 rpm is preferably between 3 and 40 mPa·s. More preferably the viscosity at 45° C. and at a shear rate of 1000 $s^{-1}$ is less than 15 mPa·s.

Solvent Resistance

Solvent resistance was evaluated by rubbing the surface of the soldermask with a cotton wool ball, soaked in methylene chloride ($CH_2Cl_2$) for 1 minute. The coating was then examined for any lifting, blistering or peeling and scratched using a finger nail to see if it had been softened. After visual evaluation results were rated from 1 (good) to 5 (poor).

Storage Stability

Storage stability was evaluated by measuring the increase in viscosity at 25 deg C. of the soldermask, after storage for 7 days at 60° C.

Preparation of the Cyan and Yellow Pigment Disperseons CPD and YPD

Concentrated Cyan and Yellow and pigment dispersions, respectively CPD and YPD, were prepared having a composition according to Table 5.

TABLE 5

| wt % of: | CPD | YPD |
|---|---|---|
| Cyan | 15 | — |
| Yellow | — | 15 |
| Disperbyk 162 | 15 | = |
| INHIB | 1 | = |
| VEEA | 69 | = |

CPD and YPD were prepared as follows: 138 g of 2-(2-vinyloxyethoxy)ethyl acrylate, 2 g of a solution containing 4 wt % of 4-methoxyphenol, 10 wt % of 2,6-Di-tert-butyl-4-methylphenol and 3.6 wt % of Aluminum-N-nitroso phenylhydroxyl amine in dipropylene glycol diacrylate, 200 g of a 30 wt % solution of Disperbyk 162 in 2-(2-Vinyloxyethoxy)ethyl acrylate and 60 g of Cyan (for CPD) or 60 g of Yellow (for YPD) were mixed using a DISPERLUX™ dispenser. Stirring was continued for 30 minutes. The vessel was connected to a NETZSCH MiniZeta mill filled with 900 g of 0.4 mm yttrium stabilized zirconia beads ("high wear resistant zirconia grinding media" from TOSOH Co.). The mixture was circulated over the mill for 120 minutes (residence time of 45 minutes) and a rotation speed in the mill of about 10.4 m/s. During the complete milling procedure the content in the mill was cooled to keep the temperature below 60° C. After milling, the dispersion was discharged into a vessel.

The resulting concentrated pigment dispersions CPD and YPD exhibited an average particle size of respectively 80 nm and 131 nm, as measured with a Malvern™ nano-S, and a viscosity of respectively 51 mPa·s and 114 mPa·s at 25° C. and at a shear rate of 10 s$^{-1}$.

Example 1

This example illustrates the effect of different flame retardants on UV curing, adhesion and solvent resistance properties of a cationic polymerizable solder mask inkjet ink.

Preparation of the Radiation Curable Inks COMP-1 to COMP-5 and INV-1 to INV-4

The comparative radiation curable ink COMP-1 to COMP-5 and the inventive radiation curable inkjet ink INV-1 to INK-4 were prepared according to Table 6. The weight percentages (wt %) are all based on the total weight of the radiation curable inkjet ink.

TABLE 6

| wt % of component | COMP-1 | INV-1 | INV-2 | INV-3 | COMP-2 | INV-4 |
|---|---|---|---|---|---|---|
| CPD | 3.20 | 2.40 | = | = | = | = |
| YPD | 1.60 | 2.40 | = | = | = | = |
| TTA3150 | 16.50 | 11.50 | = | = | = | = |
| 2005 | 19.3 | 22.40 | = | = | = | = |
| G22 | 0.40 | 0.80 | = | = | = | = |
| BL550 | 9.40 | 8.30 | = | = | = | = |
| ITX | 1.40 | 1.20 | = | = | = | = |
| Tego 2100 | 0.10 | 0.1 | = | = | = | = |
| VEEA | 48.10 | 42.1 | = | = | = | = |
| FR-16 | — | 8.80 | — | — | — | — |
| FR-05 | — | — | 8.80 | — | — | — |
| FR-01 | — | — | — | 8.80 | — | — |
| FRC-02 | — | — | — | — | 8.80 | — |
| FR-02 | — | — | — | — | — | 8.80 |
| FRC-03 | — | — | — | — | — | — |

| wt % of component | COMP-3 | COMP-4 | COMP-5 |
|---|---|---|---|
| CPD | 2.4 | = | = |
| YPD | 2.4 | = | = |
| TTA3150 | 11.5 | = | = |
| 2005 | 22.4 | = | = |
| G22 | 0.8 | = | = |

| wt % of component | COMP-1 | INV-1 | INV-2 | INV-3 | COMP-2 | INV-4 |
|---|---|---|---|---|---|---|
| BL550 | 8.3 | = | = | | | |
| ITX | 1.2 | = | = | | | |
| Tego 2100 | 0.1 | = | = | | | |
| VEEA | 42.1 | = | = | | | |
| FRC-03 | 8.80 | — | — | | | |
| FRC-04 | — | 8.80 | — | | | |
| FRC-01 | — | — | 8.80 | | | |

The performance of the inks was tested as described above. The results are shown in Table 7.

TABLE 7

| UV curable ink jet ink | Cure speed | X-hatch | Solvent resistance | Solder Resistance |
|---|---|---|---|---|
| COMP-1 | — | — | — | 5 |
| INV-1 | 2 | 1 | 1 | 2 |
| INV-2 | 2 | 4 | 2 | 4 |
| INV-3 | 3 | 3 | 1 | 2 |
| COMP-2 | 4 | 5 | 4 | 3 |
| INV-4 | 1 | 1 | 1 | 2 |
| COMP-3 | 5 | — | — | — |
| COMP-4 | 4 | 1 | 2 | 3 |
| COMP-5 | 4 | 1 | 2 | 4 |

It is clear from the results of Table 7 that radiation curable solder mask inkjet inks comprising a flame retardant according to the present invention have a higher cure speed compared with those having a comparative flame retardant.

Example 2

This example shows the improvement in flammability between inventive solder mask inkjet ink INV-4 using FR-2 compared to inkjet ink COMP-1, containing no flame retardant.

The flammability was tested with the vertical burn test described above.

TABLE 8

| Ink | Sample ID | T1 | T2 |
|---|---|---|---|
| COMP-1 | 1 | 2 | 1 |
| | 2 | 2 | 2 |
| | 3 | 1 | 9 |
| | 4 | 4 | 1 |
| | 5 | 2 | 1 |
| Total T1, T2 | | 11 | 14 |
| Total burn time | | | 25 |

TABLE 9

| Ink | Sample ID | T1 | T2 |
|---|---|---|---|
| INV-4 | 1 | 1 | 2 |
| | 2 | 2 | 1 |
| | 3 | 2 | 4 |
| | 4 | 3 | 1 |
| | 5 | 1 | 1 |
| Total T1, T2 | | 9 | 9 |
| Total burn time | | | 18 |

It is clear from the results shown above in Tables 8 and 9 that the inventive inkjet ink INV-4 comprising a flame retardant according to the invention have a lesser flammability compared to the comparative ink COMP-01 that does not comprise a flame retardent.

Example 3

This example illustrates the effect of different flame retardants on the flammability of a free radical polymerizable solder mask inkjet ink.

The comparative radiation curable inkjet ink COMP-06 and the inventive radiation curable inkjet inks INV-05 to INV-07 were prepared according to Table 10. The weight percentages (wt %) are all based on the total weight of the radiation curable inkjet ink.

TABLE 10

| wt % of component | COMP-06 | INV-05 | INV-06 | INV-07 | INV-08 |
|---|---|---|---|---|---|
| CPD | 3.30 | = | = | = | = |
| YPD | 3.30 | = | = | = | = |
| CTFA | 20.00 | = | = | = | = |
| VEEA | 24.45 | = | = | = | = |
| ACMO | 5.00 | = | = | = | = |
| CD420 | 15.00 | = | = | = | = |
| TMPTA | 5.00 | = | = | = | = |
| PB5 | 5.00 | = | = | = | = |
| ITX | 4.00 | = | = | = | = |
| TPO | 2.95 | = | = | = | = |
| EPD | 4.00 | = | = | = | = |
| BAPO | 2.00 | = | = | = | = |
| CEA | 5.00 | = | = | = | = |
| FR-09 | — | 2 | 6 | 10 | — |
| FR-01 | — | — | — | — | 10 |
| Ebecryl 1360 | 0.10 | = | = | = | = |
| AK | | = | = | = | = |
| INHIB | 0.90 | = | = | = | = |

The flammability has been tested as described above. The results are given in Table 11.

TABLE 11

| Sample | | T1 | T2 | Total Burntime |
|---|---|---|---|---|
| COMP-06 | 1 | FB* | — | — |
| | 2 | FB | — | |
| | 3 | 15 | — | |
| | 4 | FB | — | |
| | 5 | FB | — | |
| INV-05 | 1 | 1 | 0 | 9 |
| | 2 | 2 | 0 | |
| | 3 | 0 | 1 | |
| | 4 | 1 | 1 | |
| | 5 | 2 | 1 | |
| INV-06 | 1 | 1 | 1 | 8 |
| | 2 | 1 | 0 | |
| | 3 | 1 | 1 | |
| | 4 | 1 | 0 | |
| | 5 | 1 | 1 | |
| INV-07 | 1 | 1 | 0 | 11 |
| | 2 | 1 | 1 | |
| | 3 | 2 | 2 | |
| | 4 | 2 | 0 | |
| | 5 | 1 | 1 | |
| INV-08 | 1 | 0 | 0 | 8 |
| | 2 | 1 | 0 | |
| | 3 | 3 | 2 | |
| | 4 | 0 | 0 | |
| | 5 | 1 | 1 | |

*Fully Burned

It is clear from the results of Table 11 that adding a flame retardant according to the present invention improves the flammability of a free radical polymerizable solder mask inkjet ink. The other properties of the inventive inkjet inks, such as adhesion, solder resistance, etc., remained at a high level.

The invention claimed is:

1. A radiation curable inkjet ink comprising:
   a photoinitiator;
   a polymerizable compound; and
   a flame retardant having a chemical structure according to Formula I:

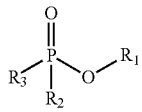

Formula I wherein
   $R_1$ is independently selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group, and a substituted or unsubstituted aryl group;
   $R_2$ is selected from the group consisting of $OR_4$, a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, and a substituted or unsubstituted aryl group;
   $R_3$ is selected from the group consisting of $OR_5$, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, and a substituted or unsubstituted aryl group;
   $R_4$ and $R_5$ are selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group, and a substituted or unsubstituted aryl group; and
   at least one of $R_1$ to $R_5$ represents a substituted or unsubstituted aryl group.

2. The radiation curable inkjet ink according to claim 1, wherein at least two of the groups $R_1$ to $R_5$ represent a substituted or unsubstituted aryl group.

3. The radiation curable inkjet ink according to claim 1, wherein $R_1$ to $R_5$ each represent a substituted or unsubstituted aryl group.

4. The radiation curable inkjet ink according to claim 1, wherein the flame retardant has a chemical structure according to Formula II:

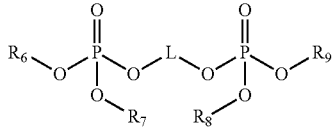

Formula II wherein
   $R_6$ to $R_9$ independently represent a substituted or unsubstituted aryl group; and
   L represents a divalent linking group coupled to the phosphate groups via an aromatic carbon atom.

5. The radiation curable inkjet ink according to claim 4, wherein the flame retardant is a diphosphate ester of a difunctional phenol compound selected from the group consisting of bisphenol A, bisphenol AP, bisphenol B, bisphenol BP, bisphenol C, bisphenol E, bisphenol F, bisphenol G, bisphenol M, bisphenol S, bisphenol P, bisphenol PH, bisphenol TMC, bisphenol Z, and resorcinol.

6. The radiation curable inkjet ink according to claim 1, wherein the radiation curable inkjet ink is a free radical polymerizable inkjet ink or a cationic polymerizable inkjet ink.

7. The radiation curable inkjet ink according to claim 1, wherein the radiation curable inkjet ink is a cationic polymerizable inkjet ink including a cationic polymerizable compound that includes at least one epoxy, at least one vinyl ether, or at least one oxetane group.

8. The radiation curable inkjet ink according to claim 7, wherein the cationic polymerizable compound is selected from the group consisting of 7-oxabicyclo [4.1.0] hept-3-ylmethyl 7-oxabicyclo [4.1.0] heptane-3-carboxylate, bis[1-Ethyl(3-oxetanyl)]methylether, Poly [(2-oxiranyl)-1,2-cyclohexanediol ]-2-ethyl-2-(hydroxymethyl)-1,3-propanediol ether, 2-(2)vinyloxyethoxy-ethyl acrylate, 1,4-cyclohexane-dimethanol divinyl ether, trimethylol-propane trivinyl ether, triethyleneglycol divinyl ether, 3-ethyl-3-[(phenylmethoxy) methyl]-oxetane, and bis[1-ethyl(3-oxetanyl)]methyl ether.

9. The radiation curable inkjet ink according to claim 1, wherein the radiation curable inkjet ink is a free radical polymerizable inkjet ink including a radical polymerizable compound selected from the group consisting of neopentyl glycol hydroxypivalate diacrylate, isobornyl acrylate, dipropylene glycol diacrylate, trimethylol propane triacrylate, and 2-(vinylethoxy)ethyl acrylate.

10. The radiation curable inkjet ink according to claim 1, further comprising a phenolic resin or a hydroxystyrene based resin.

11. A method of manufacturing an electronic device comprising:
jetting the radiation curable inkjet ink as defined in claim 1 onto a dielectric substrate including an electrically conductive pattern; and
curing the radiation curable inkjet ink jetted onto the dielectric substrate.

12. The method according to claim 11, wherein the curing is performed using UV radiation.

13. The method according to claim 11, further comprising:
heating the radiation curable inkjet ink cured on the dielectric substrate.

14. The method according to claim 13, wherein the heating is performed at a temperature between 80° C. and 250° C.

15. The method according to claim 11, wherein the electronic device is a Printed Circuit Board.

* * * * *